United States Patent
Tang

(10) Patent No.: US 9,899,333 B2
(45) Date of Patent: Feb. 20, 2018

(54) METHOD FOR FORMING CRACK-STOPPING STRUCTURES

(71) Applicant: UNITED MICROELECTRONICS CORP., Hsin-Chu (TW)

(72) Inventor: Kuang-Hui Tang, Kaohsiung (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 28 days.

(21) Appl. No.: 15/219,272

(22) Filed: Jul. 25, 2016

(65) Prior Publication Data
US 2016/0336274 A1    Nov. 17, 2016

Related U.S. Application Data

(62) Division of application No. 14/220,140, filed on Mar. 20, 2014, now Pat. No. 9,431,350.

(51) Int. Cl.
| | | |
|---|---|---|
| H01L 29/04 | (2006.01) | |
| H01L 29/10 | (2006.01) | |
| H01L 31/00 | (2006.01) | |
| H01L 23/544 | (2006.01) | |
| H01L 23/00 | (2006.01) | |
| H01L 21/762 | (2006.01) | |
| H01L 23/58 | (2006.01) | |
| H01L 21/784 | (2006.01) | |
| H01L 23/48 | (2006.01) | |
| H01L 21/56 | (2006.01) | |

(Continued)

(52) U.S. Cl.
CPC ............ *H01L 23/544* (2013.01); *H01L 21/56* (2013.01); *H01L 21/76232* (2013.01); *H01L 21/76898* (2013.01); *H01L 21/784* (2013.01); *H01L 23/481* (2013.01); *H01L 23/562* (2013.01); *H01L 23/585* (2013.01); *H01L 21/78* (2013.01); *H01L 22/34* (2013.01); *H01L 23/522* (2013.01); *H01L 2223/5442* (2013.01); *H01L 2223/5446* (2013.01); *H01L 2223/54426* (2013.01); *H01L 2924/0002* (2013.01); *H01L 2924/14* (2013.01); *H01L 2924/3512* (2013.01); *H01L 2924/35121* (2013.01); *H01L 2924/37001* (2013.01)

(58) Field of Classification Search
CPC ..... H01L 23/481; H01L 23/50; H01L 23/528; H01L 23/562; H01L 2223/5446; H01L 2924/3512
See application file for complete search history.

(56) References Cited

U.S. PATENT DOCUMENTS

| | | |
|---|---|---|
| 7,544,602 B2 | 6/2009 | Clevenger et al. |
| 8,384,197 B2 | 2/2013 | Nakamura |

(Continued)

FOREIGN PATENT DOCUMENTS

JP       2013120870      6/2013

*Primary Examiner* — Ismail Muse
(74) *Attorney, Agent, or Firm* — Winston Hsu

(57) ABSTRACT

A crack-stopping structure includes a semiconductor wafer comprising a plurality of dies defined by a plurality of scribe line regions, a plurality of metal patterns formed in the scribe line regions, and a plurality of groups of through silicon holes (TSHs) formed in the scribe line regions. The wafer further includes a front side and a back side, and the TSHs respectively include at least a bottom opening formed in the bottom side of the wafer. The groups of TSHs are formed between the metal patterns and the dies.

6 Claims, 11 Drawing Sheets

(51) Int. Cl.
*H01L 21/768* (2006.01)
*H01L 23/522* (2006.01)
*H01L 21/66* (2006.01)
*H01L 21/78* (2006.01)

(56) References Cited

U.S. PATENT DOCUMENTS

| | | | |
|---|---|---|---|
| 2005/0194670 A1* | 9/2005 | Kameyama | H01L 21/76898 257/678 |
| 2007/0102791 A1 | 5/2007 | Wu | |
| 2007/0262462 A1 | 11/2007 | Shimizu | |
| 2007/0293019 A1* | 12/2007 | Jeng | B28D 5/022 438/460 |
| 2008/0164468 A1* | 7/2008 | Chen | H01L 23/585 257/48 |
| 2008/0197514 A1* | 8/2008 | Goida | H01L 23/296 257/687 |
| 2008/0274603 A1 | 11/2008 | Do | |
| 2009/0115025 A1 | 5/2009 | Jung | |
| 2009/0272973 A1* | 11/2009 | Yoshida | H01L 22/32 257/48 |
| 2009/0302445 A1* | 12/2009 | Pagaila | H01L 23/3121 257/678 |
| 2010/0308452 A1 | 12/2010 | Iihola | |
| 2010/0317153 A1 | 12/2010 | Do | |
| 2011/0156219 A1 | 6/2011 | Kawashima | |
| 2011/0169159 A1* | 7/2011 | Lin | H01L 21/481 257/692 |
| 2012/0156823 A1* | 6/2012 | Myung | H01L 21/78 438/65 |
| 2012/0313261 A1* | 12/2012 | Lee | H01L 21/561 257/777 |
| 2013/0147063 A1* | 6/2013 | Park | H01L 24/96 257/777 |
| 2013/0207240 A1* | 8/2013 | Lee | H01L 21/561 257/620 |
| 2013/0280889 A1 | 10/2013 | Otsuka | |
| 2014/0203387 A1* | 7/2014 | Suen | H01L 21/6836 257/431 |
| 2014/0273435 A1* | 9/2014 | Huang | H01L 21/76898 438/653 |

* cited by examiner

METHOD FOR FORMING CRACK-STOPPING STRUCTURES

CROSS REFERENCE TO RELATED APPLICATIONS

This application is a divisional of U.S. application Ser. No. 14/220,140, filed 20 Mar. 2014, the disclosure of which is hereby incorporated herein by reference in its entirety.

BACKGROUND OF THE INVENTION

1. Field of the Invention

The invention relates to a crack-stopping structure and method for forming the same, and more particularly, to a wafer crack-stopping hollow structure and method for forming the same.

2. Description of the Prior Art

In the field of semiconductor device fabrication, semiconductor devices and interconnections are formed to construct integrated circuits (ICs) on a semiconductor wafer. The fabrication of ICs may be completed through different methods and steps, but generally involves depositing layers of conductive, semiconductor, and insulating materials in precise patterns on a substrate or wafer to form the desired circuit or array patterns. Once formed, the ICs then need to be separated into individual piece-parts, so called dies or chips. The dies, which are isolated or separated from each other by scribe lines, are then separated by sawing along the scribe lines and are individually packaged.

When processing the semiconductor wafer to form multilayer structures, alignment marks are typically disposed in the scribe lines for aligning the wafer with the mask. The alignment marks usually include metal or polysilicon that are formed on and beneath an uppermost surface of the semiconductor wafer. On the other hand, testing circuits are often simultaneously fabricated on the wafer along with the actual devices. The testing circuits include a plurality of metal test pads, which are electrically connected to an external terminal through probe needles, located on the scribe lines.

It is found that when the semiconductor wafer is diced, the dicing tool such as a dicing saw usually cuts across the alignment marks and the test pads. A major consideration is that the stress resulted from the sawing process causes serious peeling at where the large metal, that is the alignment marks and test pads occupied. This results in delamination and/or cracking at the interface between the multiple layers and it extends into neighboring dies. Consequently, delamination and/or cracking impact the reliability of the ICs and hence a reduction in IC yield from a given semiconductor wafer.

SUMMARY OF THE INVENTION

According to an aspect of the present invention, a crack-stopping structure is provided. The crack-stopping structure includes a semiconductor wafer comprising a plurality of dies defined by a plurality of scribe line regions, a plurality of metal patterns formed in the scribe line regions, and a plurality of groups of through silicon holes (hereinafter abbreviated as TSHs) formed in the scribe line regions. The wafer further includes a front side and a back side, and the TSHs respectively include at least a bottom opening formed in the bottom side of the wafer. Furthermore, the groups of TSHs are formed between the metal patterns and the dies.

According to another aspect of the present invention, a method for forming a crack-stopping structure is provided. The method for forming the crack-stopping structure includes following steps. A wafer including a plurality of dies defined by a plurality of scribe line regions is provided, a plurality of groups of TSHs are formed in the scribe line regions, and a plurality of through silicon vias (hereinafter abbreviated as TSVs) are formed in the dies. More important, the groups of TSHs are not filled up with metal.

According to the crack-stopping structure and the method for forming the same provided by the present invention, the TSHs are formed in the scribe line regions and particularly formed between the metal patterns and the dies. More important, the TSHs are hollow structure having no metal or conductive material formed therein. When the semiconductor wafer is diced, stress resulted from the sawing process causes serious peeling at where the metal patterns occupied. However, the peeling or cracking is obstructed and stopped by the hollow TSHs formed between the metal patterns and the dies, and thus the neighboring dies are protected from cracking. Consequently, delamination and/or cracking, which adversely impact the reliability and yield are prevented.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 6-7 are cross-sectional views taken along a Line B-B' of FIG. 5, wherein FIG. 7 is a schematic drawing in a step subsequent to FIG. 6.

DETAILED DESCRIPTION

Figure 1:
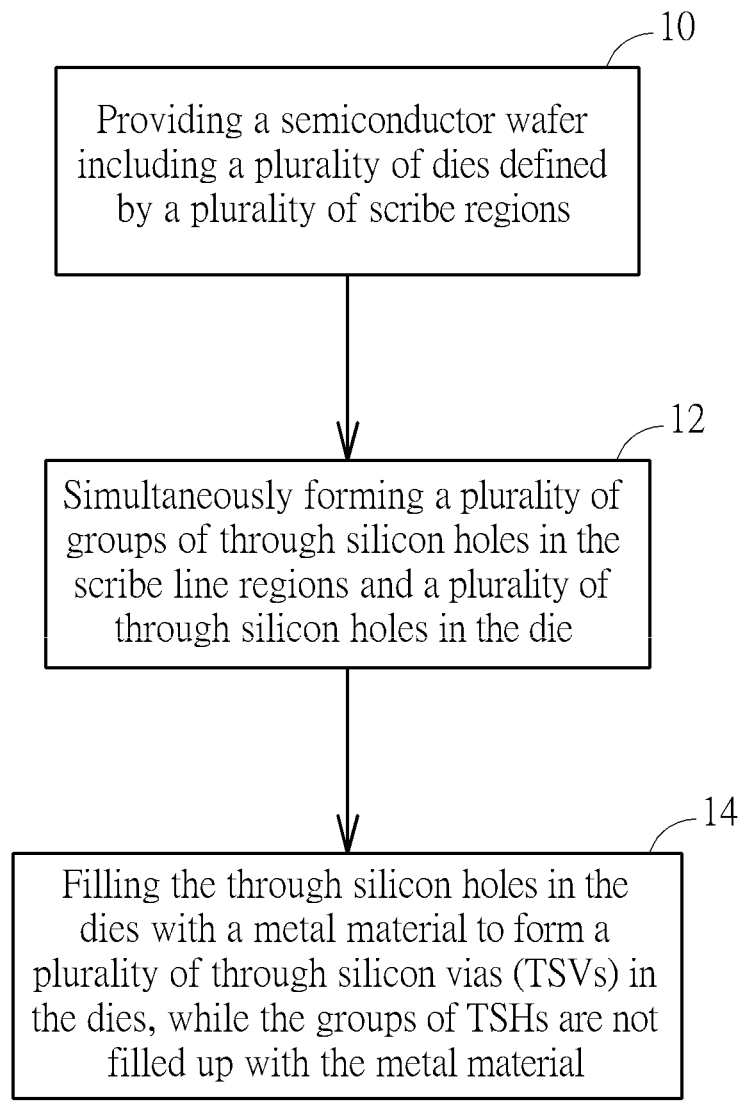
FIG. 1 is a flow chart illustrating a method for forming a crack-stopping structure provided by a first preferred embodiment of the present invention.
Figure 2:
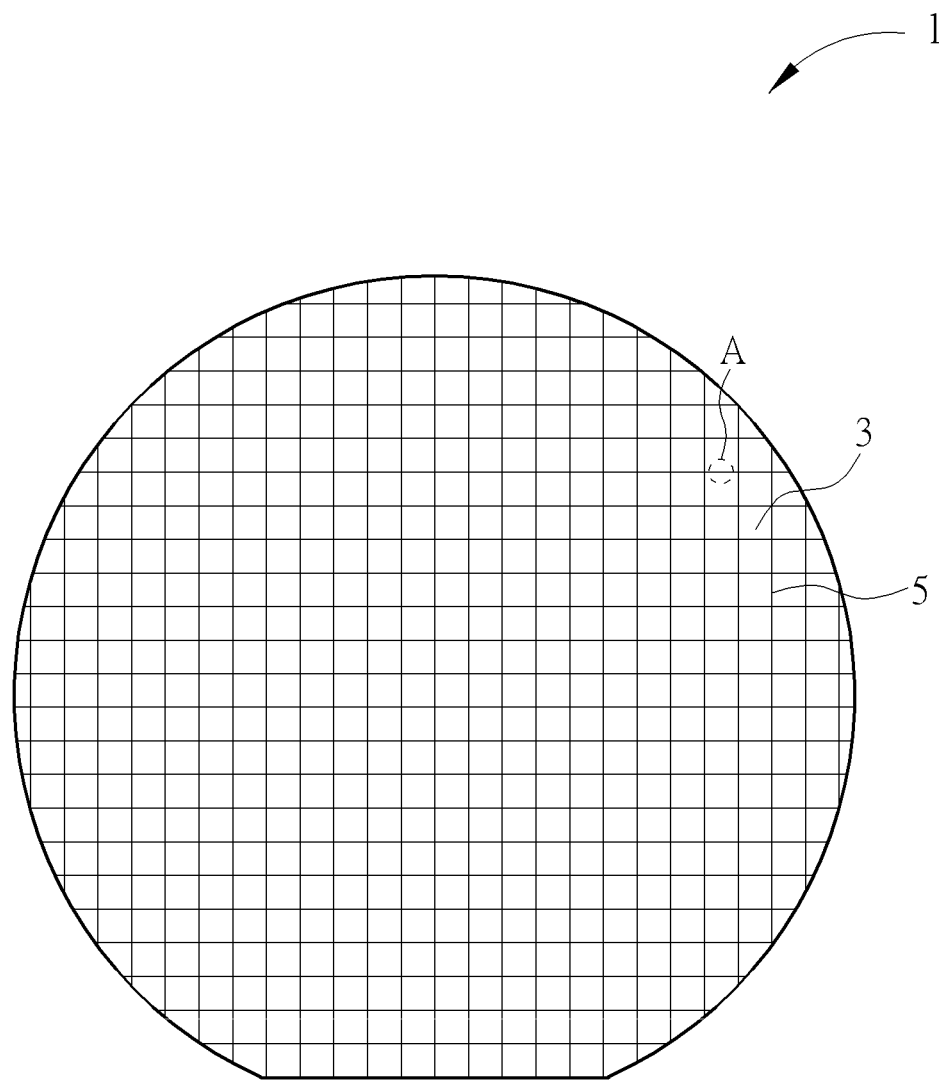
FIG. 2 is a plan view showing an overall configuration of a semiconductor wafer according to a first and a second preferred embodiment of the present invention.
Figure 3:
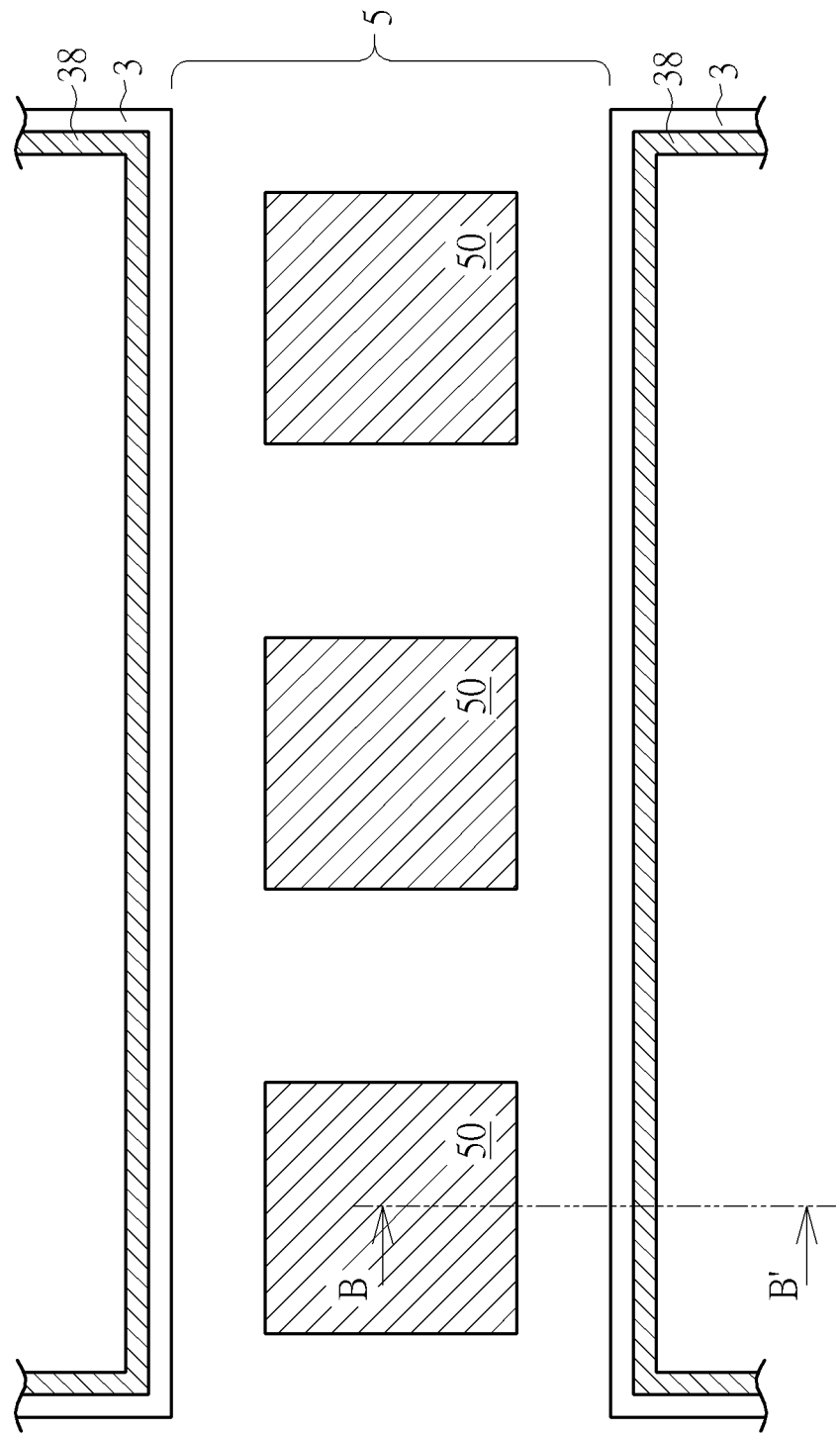
FIG. 3 is a partially enlarged view of Circle A of FIG. 2.
Figure 4:
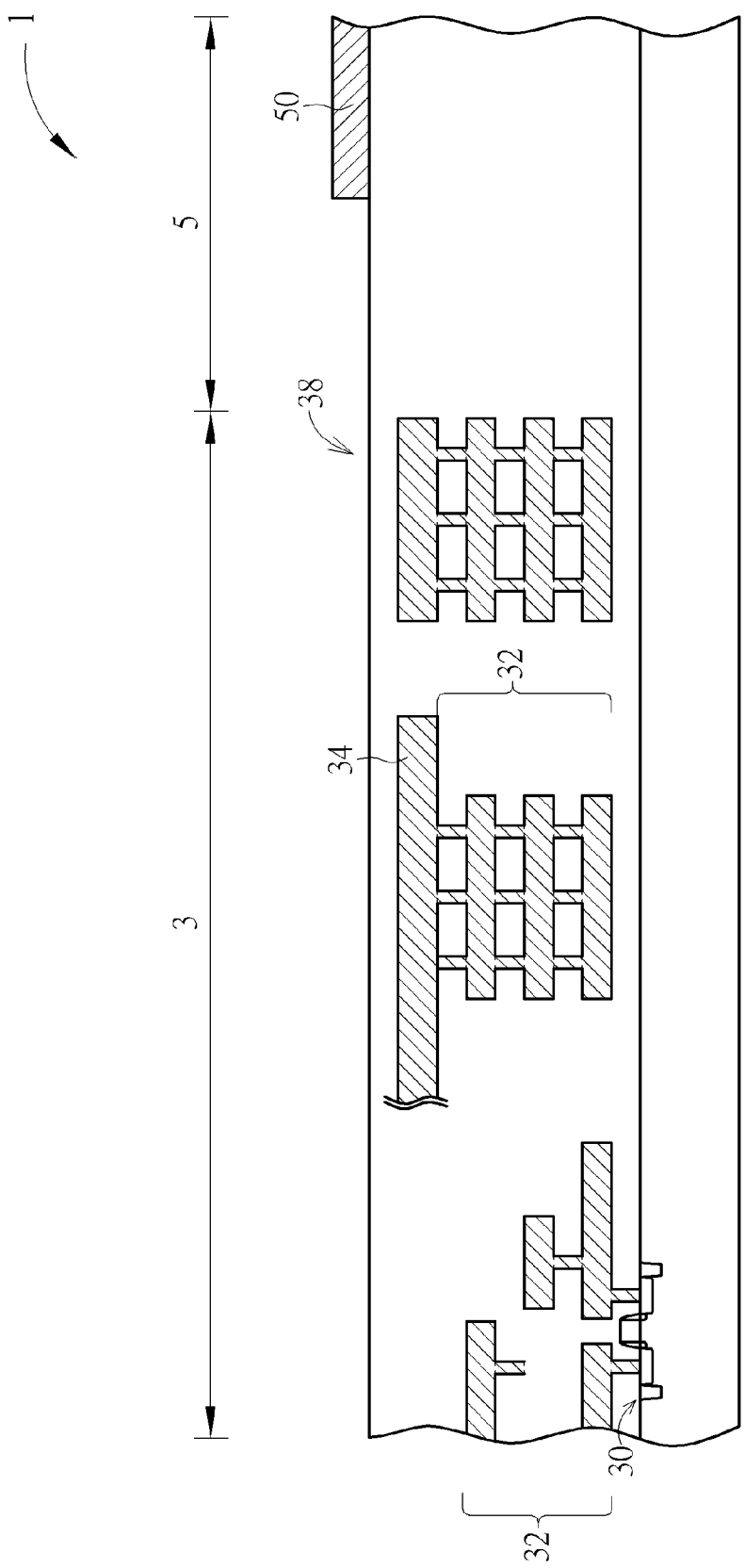
FIG. 4 is a cross-sectional view taken along a Line B-B' of FIG. 3.
Figure 5:
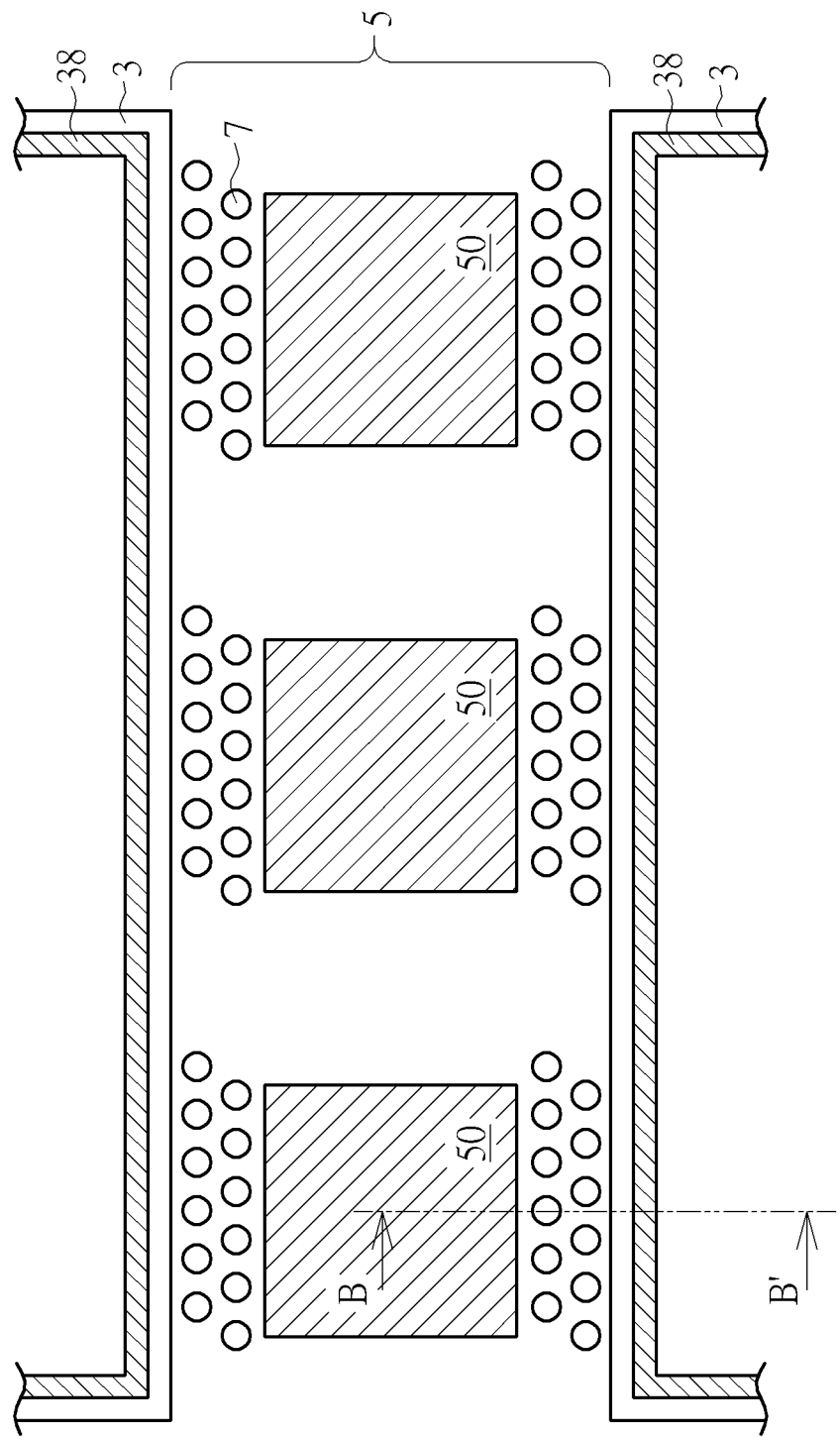
FIG. 5 is a partially enlarged view of Circle A of FIG. 2 and a schematic drawing in a step subsequent to FIG. 3.
Figure 6:
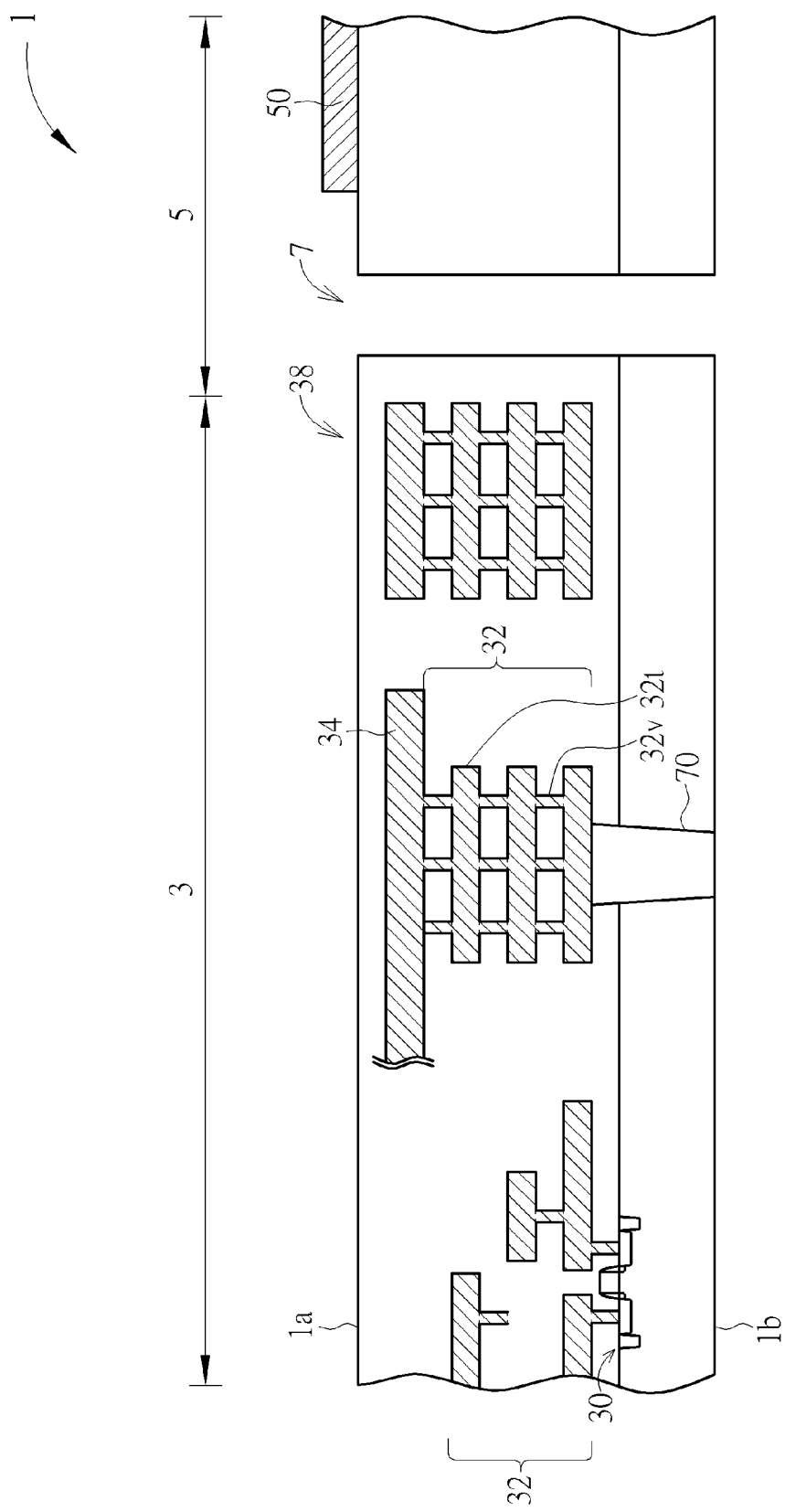
Figure 7:
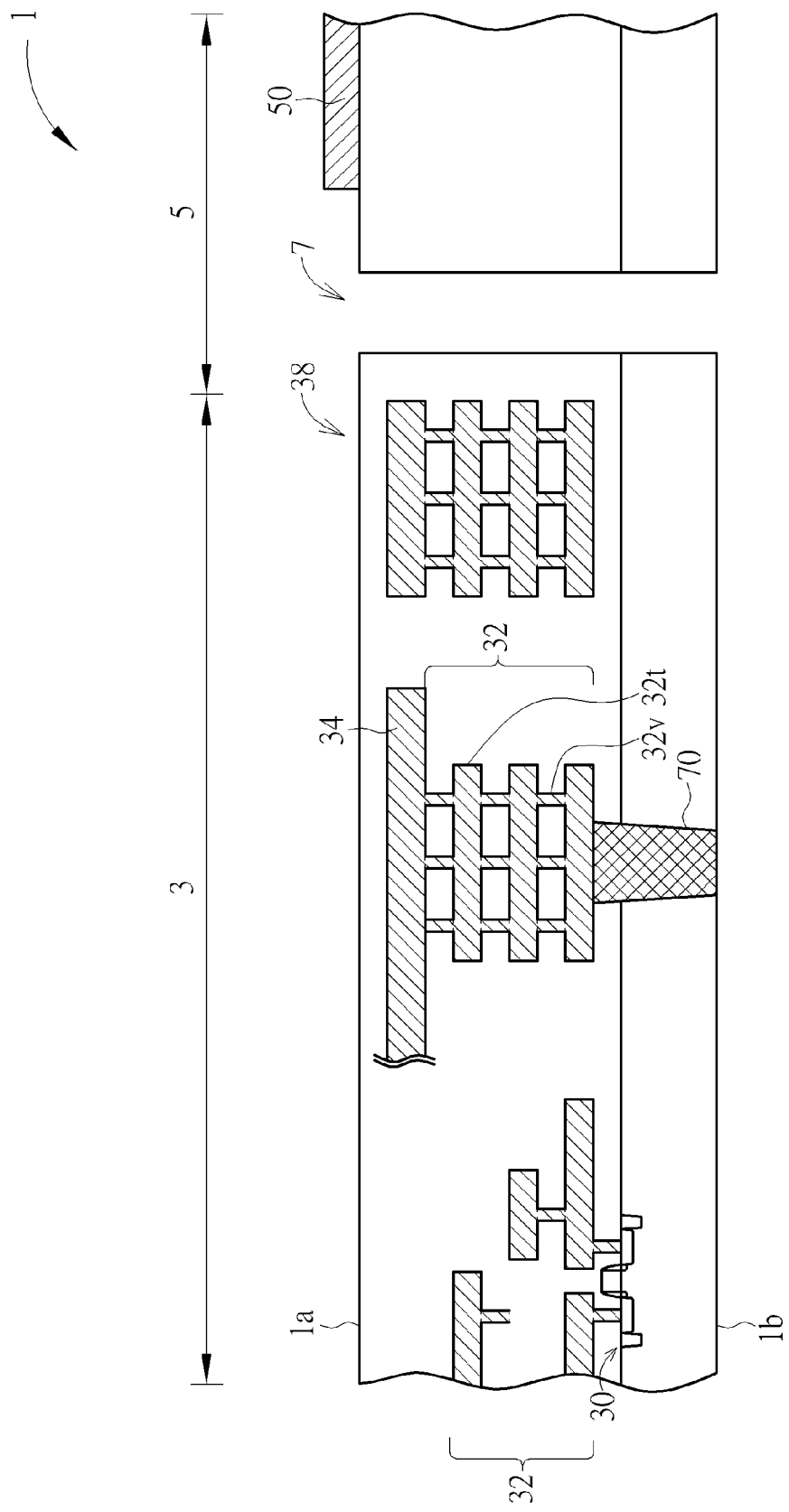

Please refer to FIGS. 1-7. FIG. 1 is a flow chart illustrating a method for forming a crack-stopping structure provided by a first preferred embodiment of the present invention. FIGS. 2-7 are schematic drawings illustrating a method for forming a crack-stopping structure provided by the first preferred embodiment, wherein FIG. 2 is a plan view showing an overall configuration of a semiconductor wafer, FIG. 3 is a partially enlarged view of Circle A of FIG. 2, FIG. 4 is a cross-sectional view taken along a Line B-B' of FIG. 3, FIG. 5 is a partially enlarged view of Circle A of FIG. 2 and in a step subsequent to FIG. 3, and FIGS. 6-7 are cross-sectional views taken along a Line B-B' of FIG. 5. As shown in FIG. 1, the method for forming a crack-stopping structure first provides a Step 10:

STEP 10: Providing a Semiconductor Wafer Comprising a Plurality of Dies Defined by a Plurality of Scribe Line Regions.

In order to clearly describe the structure of the present invention, FIGS. 2-4 should be referred together. As shown in FIGS. 2-4, the semiconductor wafer 1 includes a plurality of dies 3 that are defined and divided by a plurality of scribe line regions 5. As shown in FIG. 4, each die 3 includes a plurality of semiconductor devices 30 formed therein, and a plurality of interconnections 32 are formed on the semiconductor devices 30. The interconnections 23 can be formed by Al-wiring process or Cu-damascene process, but not limited to this. Additionally, a distribution layer and a contact pad (both not shown) are selectively formed in the dies 3 for constructing an external electrical connection, but not limited to this. More important, a die seal ring 38 is formed simultaneously with forming the interconnections 32 and the distribution layer 34. Accordingly, a plurality of die seal rings 38 are formed in the semiconductor wafer 1 for encompassing and surrounding the dies 3, respectively.

Please still refer to FIGS. 3-4. In the scribe line region 5, a plurality of metal patterns 50 are formed therein. The metal patterns 50 can include alignment marks, which serve for aligning the wafer 1 with the mask. Or, the metal patterns 50 can include a test pad electrically connected to testing circuits, which are often simultaneously fabricated on the wafer along with the actual semiconductor devices 30 and interconnections 32. It is well-known to those skilled in the art that the semiconductor devices 30, the interconnections 32, the die seal ring 38, and the metal patterns 50 are fabricated by the front-end-of-line (FEOL) process.

Please refer to FIG. 1. Next, a Step 12 is performed:
STEP 12: Simultaneously Forming a Plurality of Groups of Through Silicon Holes in the Scribe Line Regions and a Plurality of Through Silicon Holes in the Die.

Please refer to FIGS. 5-6. It is also noteworthy that the semiconductor wafer 1 includes a front side 1a and a back side 1b. Next, a plurality of groups of TSHs 7 are formed in the scribe line regions 5 and a plurality of TSHs 70 are formed in the dies 3, simultaneously. According to the preferred embodiment, the TSHs 7 and TSHs 70 are preferably formed from the back side 1b of the semiconductor wafer 1 after completion of the semiconductor devices 30 and the interconnections 32. However, the TSHs 7 and the TSHs 70 can be formed from the front side 1a of the semiconductor wafer 1 after completion of the semiconductor devices 30 and the interconnections 32 if required.

Figure 8:
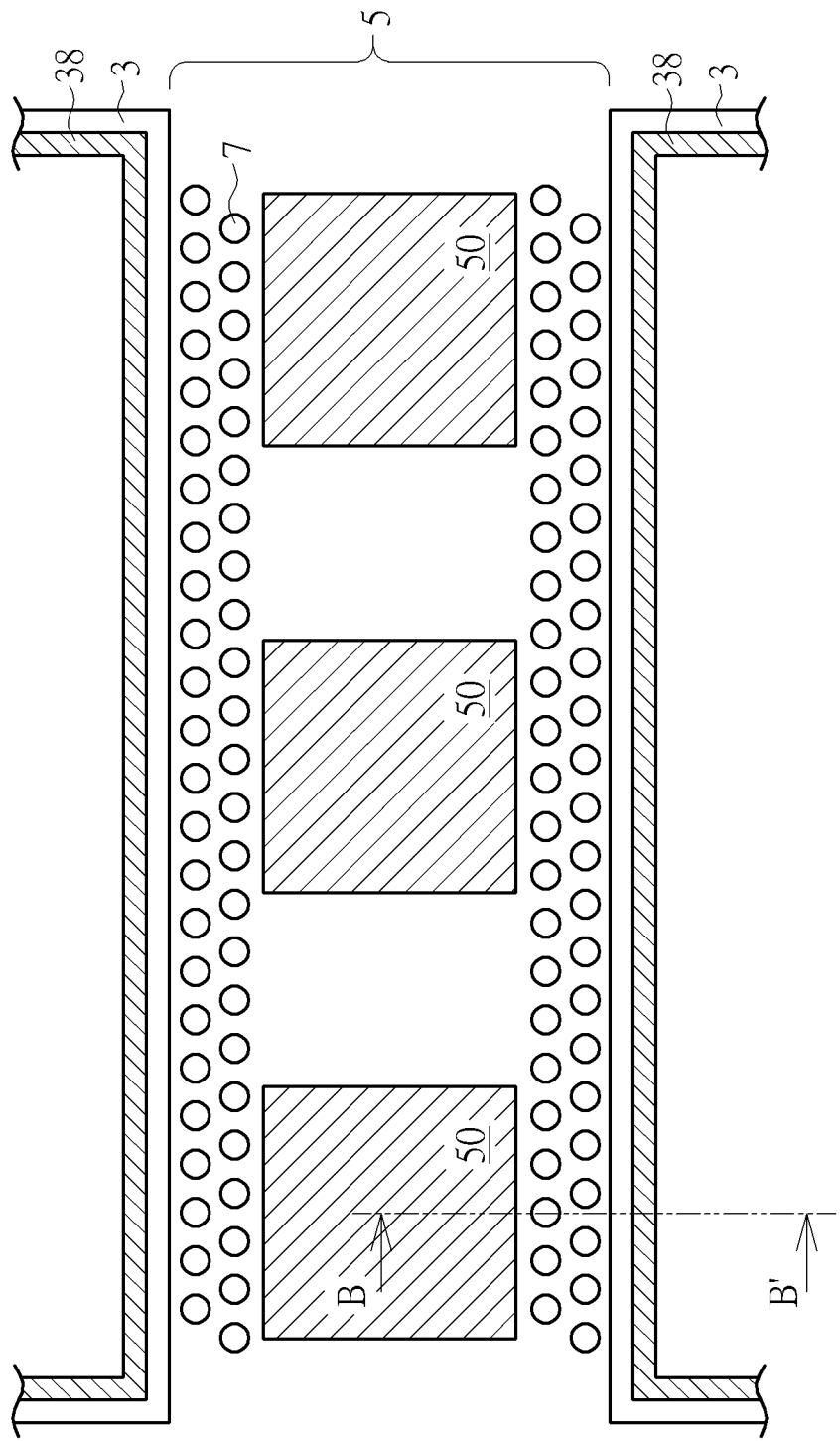
FIG. 8 is a top view of a modification to the crack-stopping structure provided by the present invention.

Please refer to FIG. 1 again. After forming the TSHs 7 and the TSH 70, a Step 14 is performed:
STEP 14: Filling the Through Silicon Holes in the Dies with a Metal Material to Form a Plurality of Through Silicon Vias in the Dies, While the Groups of TSHs are not Filled up with the Metal Material Please refer to FIG. 7. After forming the TSHs 7 in the scribe line regions 5 and the TSHs 70 in the dies 3, a barrier layer (not shown) and a buffer layer (not shown) can be formed in the TSHs 7 and the TSHs 70. The barrier layer may include Ti/TiN or Ta/TaN, but not limited to this. The buffer layer may include tungsten (W), but not limited to this. Next, a protecting layer (not shown) is formed on the TSHs 7 in the scribe line regions 5 and followed by filling up the TSHs 70 in the dies 3 with a metal material to form a plurality of through silicon vias (TSVs) 7v. Since the TSHs 7 in the scribe line regions 5 are protected by the protecting layer, the TSHs 7 in the scribe line regions 5 are not filled with the metal material and thus remained hollow as shown in FIG. 8. Additionally, the protecting layer can be formed on the TSHs 7 before forming the barrier layer and the buffer layer if required.

Please refer to FIGS. 5 and 7 again. The groups of TSHs 7 in the scribe line regions 5 are formed between the metal patterns 50 and the dies 3, more particularly, between the metal patterns 50 and the die seal rings 38. A diameter of the TSHs 7 is equal to a diameter of the TSVs 7v, but the diameter of the TSHs 7 is larger than a width of the die seal rings 38. Furthermore, it is well-known that the interconnections 32 includes trenches 32t and vias 32v filled with conductive material, and the diameter of the TSHs 7 is larger than a width of the vias 32v of the interconnections 32. Furthermore, each group of TSHs 7 is formed corresponding to the metal patterns 50, respectively. Therefore, each group of TSHs 7 is spaced apart from each other as shown in FIG. 5.

Additionally, each of the TSHs 7 provided by the preferred embodiment includes a bottom opening formed in the bottom side 1b of the semiconductor wafer 1 and a top opening formed in the front side 1a of the semiconductor wafer 1. However, since the TSVs 7v and the TSHs 7 are formed by back side via-last process according to the preferred embodiment, each of the TSHs 7 can include only a bottom opening formed in the bottom side 1b of the semiconductor wafer 1.

Please refer to FIG. 8, which is a modification to the crack-stopping structure of the present invention. According to the modification, the groups of TSHs 7 are arranged to form a continuous pattern along the die seal rings 38, as shown in FIG. 8.

According to the crack-stopping structure and the method for forming the same provided by the first preferred embodiment, the TSHs 7 in the scribe line regions 5 and the TSHs 70 in the dies 3 are simultaneously formed. But only the TSHs 70 in the dies 3 are filled up with the metal material to form the TSV 7v while the TSHs 7 in the scribe line regions 5 are remained as hollow structures. Therefore, no extra process is required. More important, when the semiconductor wafer 1 is diced, the dicing tool may cut across the metal patterns 50, and the stress resulted from the sawing process causes serious peeling at where the metal patterns 50 occupied. However, the peeling or cracking is obstructed and stopped by the hollow TSHs 7 formed between the metal patterns 50 and the dies 3, and thus the neighboring dies 3 are protected from cracking. Consequently, delamination and/or cracking, which adversely impact the reliability and yield are prevented.

Figure 9:
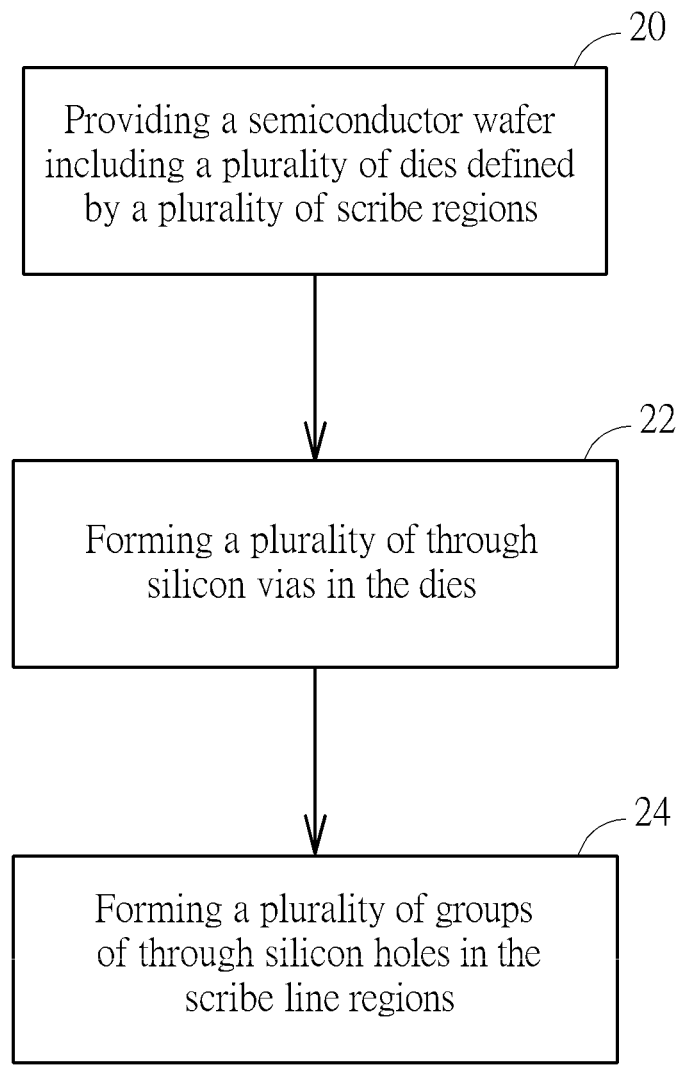
FIG. 9 is a flow chart illustrating a method for forming a crack-stopping structure provided by a second preferred embodiment of the present invention.
Figure 10:
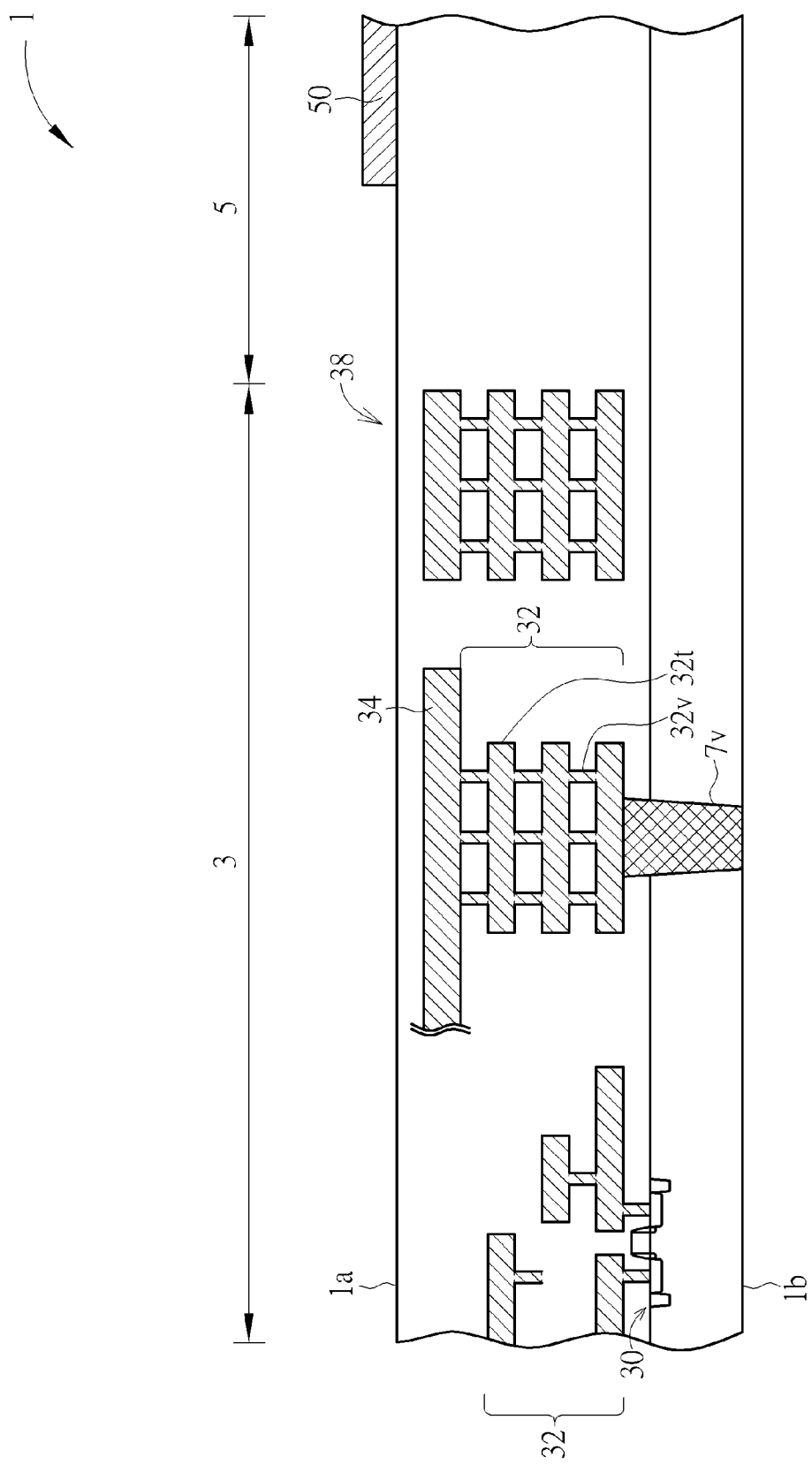
FIG. 10 is a cross-sectional view taken along a Line B-B' of FIG. 3 and illustrating the method for forming the crack-stopping structure according to the second preferred embodiment.

Please refer to FIG. 9-10, FIGS. 2-5 and 7 in the same time. FIG. 9 is a flow chart illustrating a method for forming a crack-stopping structure provided by a second preferred embodiment of the present invention. FIGS. 2-5, 7, and 10 are schematic drawings illustrating a method for forming a crack-stopping structure provided by the second preferred embodiment, wherein FIG. 2 is a plan view showing an overall configuration of a semiconductor wafer according to the second preferred embodiment of the present invention, FIG. 3 is a partially enlarged view of Circle A of FIG. 2, and FIG. 10 is a cross-sectional view taken along a Line B-B' of FIG. 3. Please note that elements the same in both of the first and second preferred embodiments are designated by the same numerals. As shown in FIG. 9, the method for forming a crack-stopping structure first provides a Step 20:

STEP 20: Providing a Semiconductor Wafer Comprising a Plurality of Dies Defined by a Plurality of Scribe Line Regions.

Please refer to FIGS. 2-4. The semiconductor wafer 1 includes a plurality of dies 3 that are defined and divided by a plurality of scribe line regions 5. Each die 3 includes a plurality of semiconductor devices 30 formed therein, and a plurality of interconnections 32 are formed on the semiconductor devices 30 as shown in FIG. 4. As mentioned above, the interconnection 32 can be formed by Al-wiring process or Cu-damascene process, but not limited to this. Additionally, a distribution layer and a contact pad (both not shown) are selectively formed in the dies 3 for constructing an external electrical connection, but not limited to this. More important, a die seal ring 38 is formed simultaneously with forming the interconnections 32 and the distribution layer 34. Accordingly, a plurality of die seal rings 38 are formed in the semiconductor wafer 1 for encompassing and surrounding the dies 3, respectively. Please still refer to FIGS. 4-5. In the scribe line region 5, a plurality of metal patterns 50 are formed therein. The metal patterns 50 can include alignment marks and/or test pads.

Please refer to FIG. 9. Next, a Step 22 is performed:

STEP 22: Forming a Plurality of Through Silicon Vias in the Dies.

Please refer to FIG. 10. It is also noteworthy that the semiconductor wafer 1 includes a front side 1a and a back side 1b. Next, a plurality of TSHs (not shown) are formed in the dies 3. After forming the TSHs in the dies 3, a barrier layer (not shown) and a buffer layer (not shown) can be formed in the TSHs in the dies 3 and followed by filling the TSHs in the dies 3 with a metal material to form a plurality of through silicon vias (TSVs) 7v.

Please refer to FIG. 9 again. Next, a Step 24 is performed:

STEP 24: Forming a Plurality of Groups of Through Silicon Holes in the Scribe Line Regions.

Please refer to FIG. 7. After forming the TSVs 7v in the dies 3, a plurality of groups of TSHs 7 are formed in the scribe line regions 5. The groups of TSHs 7 are preferably formed in a single process performed in a single machine after forming the TSVs 7v. According to the preferred embodiment, the TSHs 7 are preferably formed from the back side 1b of the semiconductor wafer 1 after completion of the semiconductor devices 30 and the interconnections 32. However, the TSHs 7 can be formed from the front side 1a of the semiconductor wafer 1 after completion of the semiconductor devices 30 and the interconnections 32.

It is noteworthy that the spatial relationship between the TSHs 7, the metal patterns 50, the die seal rings 38, and the dies 3 are the same with those described in the first preferred embodiment, and thus those details are omitted in the interest of brevity.

According to the crack-stopping structure and the method for forming the same provided by the second preferred embodiment, the TSVs 7v in the dies 3 and the TSHs 7 in the scribe line regions 5 are sequentially formed. In other words, the TSVs 7v in the dies 3 and the TSHs 7 in the scribe line regions 5 are independently formed. More important, when the semiconductor wafer 1 is diced, the dicing tool may cut across the metal patterns 50, and the stress resulted from the sawing process causes serious peeling at where the metal patterns 50 occupied. However, the peeling or cracking is obstructed and stopped by the hollow TSHs 7 formed between the metal patterns 50 and the dies 3, and thus the neighboring dies 3 are protected from cracking. Consequently, delamination and/or cracking, which adversely impact the reliability and yield are prevented.

Figure 11:
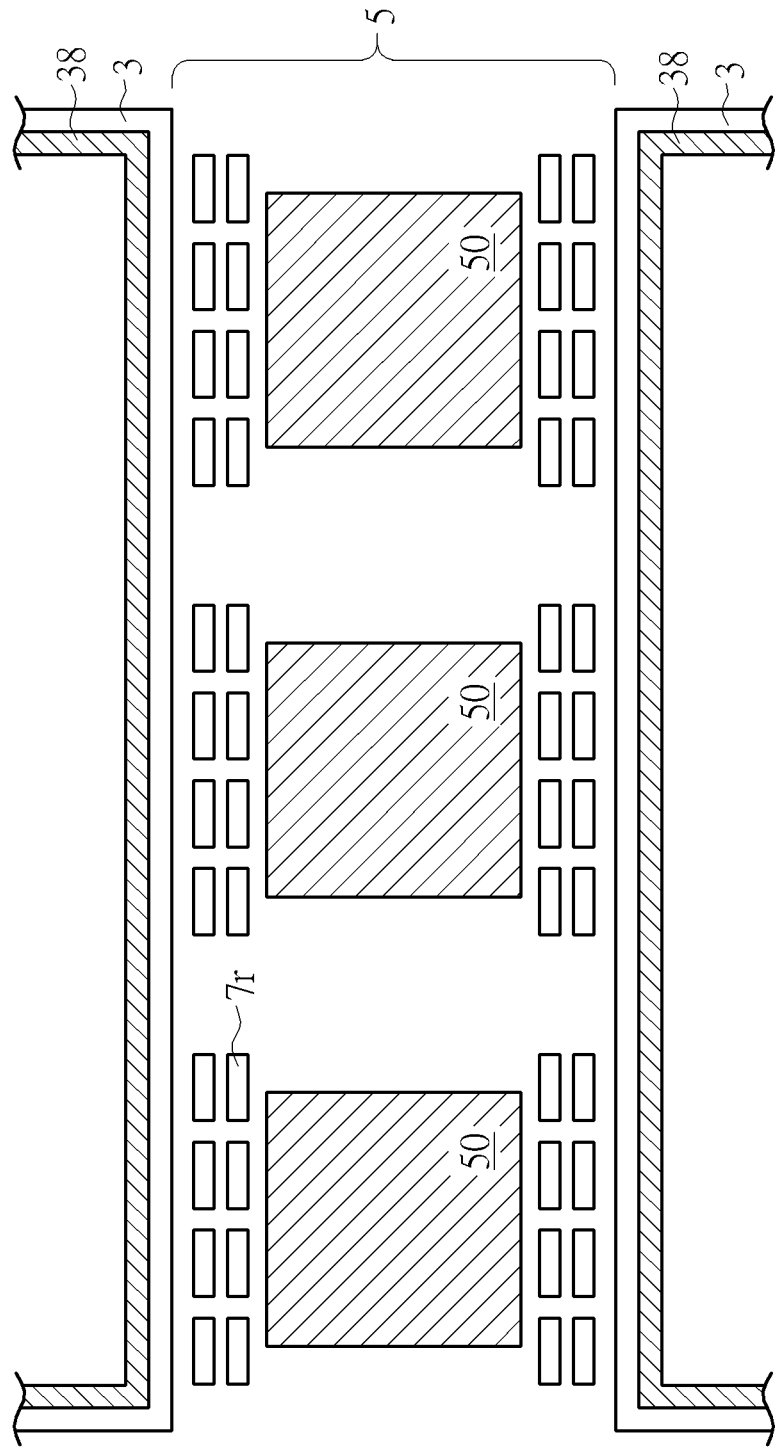
FIG. 11 is a top view of another modification to the crack-stopping structure provided by the present invention.

Additionally, please refer to FIG. 11, which is a top view of another modification to the crack-stopping structure provided by the present invention. According to the modification provided by the present invention, a plurality of groups of TSHs 7r are formed in the scribe line regions 5. More important, the TSHs in the scribe line regions 5 can include not only a round shape as shown in FIGS. 5 and 8, but also a rectangular shape as shown in FIG. 11. According to the modification, a length the TSHs 7r is smaller than a width of the metal patterns 50, but can be two to three times to a diameter of the TSVs 7v in the dies 3. The groups of TSHs 7r are arranged correspondingly to the metal patterns 50. Furthermore, the groups of TSHs 7r can be spaced apart from each other as shown in FIG. 11, but it is not limited that the groups of TSHs 7r can be arranged to form a continuous pattern along the die seal rings 38.

Still additionally, after forming the hollow TSHs 7/7r in the scribe line regions 5 simultaneously with or after forming the TSVs 7v in the dies 3, a packaging process can be performed. In the packaging process, the hollow TSHs 7 can be partially filled with a polymer, for example but not limited to, Benzocyclobutene (BCB).

It is well-known that TSV is a vertical electrical connection passing completely through the semiconductor wafer or a die so that they occupy less space. In other words, TSVs provide connections through the body of the dies leading smaller stack. And the present invention is able to be integrated with the TSV technology without complicating the processes. According to the crack-stopping structure and the method for forming the same provided by the present invention, the TSHs are formed simultaneously with or after forming the TSVs by the same methodology. The TSHs are formed in the scribe line regions and particularly formed between the metal patterns and the dies. More important, the TSHs are hollow structures having no metal or conductive material formed therein. When the semiconductor wafer is diced, the dicing tool may cut across the metal patterns, and the stress resulted from the sawing process causes serious peeling at where the metal patterns occupied. However, the peeling or cracking is obstructed and stopped by the hollow TSHs formed between the metal patterns and the dies, and thus the neighboring dies are protected from cracking. Consequently, delamination and/or cracking, which adversely impact the reliability and yield are prevented.

Those skilled in the art will readily observe that numerous modifications and alterations of the device and method may be made while retaining the teachings of the invention. Accordingly, the above disclosure should be construed as limited only by the metes and bounds of the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a crack-stopping structure, comprising:
   providing a semiconductor wafer comprising a plurality of dies defined by a plurality of scribe line regions and a plurality of metal patterns formed in a middle portion of the scribe line region;
   forming a plurality of groups of through silicon holes (TSHs) in the scribe line regions between the metal patterns and the dies, wherein each of the TSHs opens at a front side and a back side of the semiconductor wafer; and forming a plurality of through silicon vias (TSVs) in the dies, wherein the groups of TSHs are unfilled therethrough.

2. The method for forming the crack-stopping structure according to claim 1, wherein the semiconductor wafer comprises a plurality of semiconductor devices and interconnections formed therein.

3. The method for forming the crack-stopping structure according to claim 2, wherein the groups of TSHs are formed from the front side of the semiconductor wafer after completion of the semiconductor devices and the interconnections.

4. The method for forming the crack-stopping structure according to claim 2, wherein the groups of TSHs are formed from the back side of the semiconductor wafer after completion of the semiconductor devices and the interconnections.

5. The method for forming the crack-stopping structure according to claim 1, wherein the step of forming the TSVs further comprises:

forming a plurality of through silicon holes in the dies and the groups of TSHs in the scribe line regions simultaneously; and filling up the through silicon holes in the dies with the metal to form the TSVs, and the groups of TSHs in the scribe line regions are not filled up with the metal.

6. The method for forming the crack-stopping structure according to claim 1, wherein the groups of TSHs are formed in a single process performed in a single machine after forming the TSVs.

* * * * *